(12) United States Patent
Chou

(10) Patent No.: US 7,304,851 B2
(45) Date of Patent: Dec. 4, 2007

(54) HEAT SINK AND ITS FABRICATION METHOD

(75) Inventor: Yen-Hsun Chou, Taoyuan County (TW)

(73) Assignee: Yuh-Cheng Chemical Ltd., Taipei (TW)

( * ) Notice: Subject to any disclaimer, the term of this patent is extended or adjusted under 35 U.S.C. 154(b) by 338 days.

(21) Appl. No.: 11/156,599

(22) Filed: Jun. 21, 2005

(65) Prior Publication Data

US 2006/0285296 A1 Dec. 21, 2006

(51) Int. Cl.
*H05K 7/20* (2006.01)
*F28F 7/00* (2006.01)

(52) U.S. Cl. ............. 361/710; 361/704; 361/709; 361/703; 165/78; 165/80.3; 165/185; 174/16.3; 29/890.03; 257/722

(58) Field of Classification Search ............. 361/709, 361/704, 710, 703; 165/78, 80.3, 185; 257/722; 174/16.3; 29/890.03
See application file for complete search history.

(56) References Cited

U.S. PATENT DOCUMENTS

| | | | | |
|---|---|---|---|---|
| 4,669,535 A * | 6/1987 | Seidler | ................. | 165/78 |
| 5,038,858 A * | 8/1991 | Jordan et al. | ................ | 165/185 |
| 5,529,120 A * | 6/1996 | Howard et al. | ............. | 165/166 |
| 5,558,155 A * | 9/1996 | Ito | ............... | 165/80.3 |
| 6,336,498 B1 * | 1/2002 | Wei | ................. | 165/80.3 |
| 6,340,056 B1 * | 1/2002 | Huang et al. | ................ | 165/185 |
| 6,382,307 B1 * | 5/2002 | Wang et al. | ................. | 165/80.3 |
| 6,386,275 B1 * | 5/2002 | Kuo et al. | .................. | 165/80.3 |
| 6,401,810 B1 * | 6/2002 | Kuo et al. | .................. | 165/185 |
| 6,449,160 B1 * | 9/2002 | Tsai | ........................ | 361/709 |
| 6,474,407 B1 * | 11/2002 | Chang et al. | .............. | 165/80.3 |
| 6,595,275 B1 * | 7/2003 | Wang et al. | ................. | 165/185 |
| 6,607,023 B2 * | 8/2003 | Ho et al. | ...................... | 165/78 |
| 6,607,028 B1 * | 8/2003 | Wang et al. | ................. | 165/185 |
| 6,619,381 B1 * | 9/2003 | Lee | .............. | 165/78 |
| 6,639,802 B1 * | 10/2003 | Dong et al. | ................. | 361/709 |
| 6,644,386 B1 * | 11/2003 | Hsu | ......................... | 165/80.3 |
| 6,644,397 B1 * | 11/2003 | Shen | ......................... | 165/185 |
| 6,651,733 B1 * | 11/2003 | Horng et al. | .............. | 165/80.3 |
| 6,655,448 B1 * | 12/2003 | Lin | ........................ | 165/80.3 |
| 6,672,379 B1 * | 1/2004 | Wang et al. | ................. | 165/185 |
| 6,729,384 B1 * | 5/2004 | Lo | ............ | 165/80.3 |
| 6,729,385 B1 * | 5/2004 | Huang et al. | .............. | 165/80.3 |
| 6,742,581 B2 * | 6/2004 | Mochizuki et al. | ......... | 165/185 |
| 6,754,079 B1 * | 6/2004 | Chang | ........................ | 361/709 |

(Continued)

FOREIGN PATENT DOCUMENTS

JP 2001196779 A * 7/2001

*Primary Examiner*—Anatoly Vortman
(74) *Attorney, Agent, or Firm*—Browdy and Neimark, PLLC

(57) ABSTRACT

A heat sink is disclosed to include a plurality of metal plate members arranged in a stack, each metal plate member having a rectangular body, a first sidewall and a second sidewall at two sides of the rectangular body, a T-shaped mounting hole in the rectangular body adjacent to the first sidewall, and a lug downwardly extending from the first sidewall, the lug having a head and a neck connected between the head and the first sidewall. By inserting the lug of one first plate member into the T-shaped mounting hole of one second plate member and then deforming the first sidewall of the second plate member, the plate members are firmly secured together, forming the desired heat sink.

5 Claims, 7 Drawing Sheets

U.S. PATENT DOCUMENTS

| | | | |
|---|---|---|---|
| 6,765,799 B1 * | 7/2004 | Huang | 361/709 |
| 6,766,852 B1 * | 7/2004 | Chen | 165/185 |
| 6,772,828 B1 * | 8/2004 | Chen | 165/78 |
| 6,789,609 B2 * | 9/2004 | Tsai et al. | 165/78 |
| 6,842,342 B1 * | 1/2005 | Lin | 361/710 |
| 6,871,698 B2 * | 3/2005 | Lee et al. | 165/80.3 |
| 6,880,621 B2 * | 4/2005 | Wang | 165/80.3 |
| 6,883,591 B2 * | 4/2005 | Lai | 165/78 |
| 6,901,993 B2 * | 6/2005 | Lee et al. | 165/80.3 |
| 6,942,026 B2 * | 9/2005 | Lin et al. | 165/185 |
| 6,995,981 B2 * | 2/2006 | Huang et al. | 361/703 |
| 7,025,122 B2 * | 4/2006 | You-Tien | 165/80.3 |
| 7,028,755 B2 * | 4/2006 | Fu et al. | 165/80.3 |
| 7,032,650 B1 * | 4/2006 | Tian | 165/80.3 |
| 7,044,197 B2 * | 5/2006 | Lee et al. | 165/80.3 |
| 7,121,326 B2 * | 10/2006 | Lee et al. | 165/80.3 |
| 7,124,808 B2 * | 10/2006 | Liu | 165/80.3 |
| 7,163,049 B2 * | 1/2007 | Zhong et al. | 165/80.3 |
| 7,165,601 B1 * | 1/2007 | Hashimoto | 165/78 |
| 7,174,955 B2 * | 2/2007 | Zhong et al. | 165/185 |
| 7,190,588 B2 * | 3/2007 | Lee et al. | 361/704 |
| 2003/0116304 A1 * | 6/2003 | Ho et al. | 165/80.3 |
| 2004/0150955 A1 * | 8/2004 | Lin | 361/709 |
| 2004/0159421 A1 * | 8/2004 | Wang | 165/80.3 |
| 2004/0182543 A1 * | 9/2004 | Shao | 165/80.3 |
| 2004/0194922 A1 * | 10/2004 | Lee et al. | 165/78 |
| 2004/0207984 A1 * | 10/2004 | Huang et al. | 361/703 |
| 2004/0231827 A1 * | 11/2004 | Fu et al. | 165/80.3 |
| 2005/0022972 A1 * | 2/2005 | Cheng-Tung et al. | 165/80.3 |
| 2005/0051297 A1 * | 3/2005 | Kuo | 165/80.3 |
| 2005/0279523 A1 * | 12/2005 | Chen | 174/52.2 |
| 2006/0162920 A1 * | 7/2006 | Chou | 165/185 |
| 2006/0180923 A1 * | 8/2006 | Chou | 257/706 |
| 2006/0213641 A1 * | 9/2006 | Chou | 165/80.3 |

* cited by examiner

HEAT SINK AND ITS FABRICATION METHOD

BACKGROUND OF THE INVENTION

1. Field of the Invention

The present invention relates to a heat sink for dissipating heat from a heat source and more particularly, to such a heat sink, which has a steady structure and is easy to assemble.

2. Description of the Related Art

A conventional heat sink 1, as shown in FIG. 1, comprises a plurality of metal plate members 2 arranged in a stack. Each metal plate member 2 comprises a plurality of mounting lugs 3 and a plurality of mounting holes 4. Each mounting lug 3 has a base 5 and two arms 6 at two sides of the base 5. During installation, the mounting lugs 3 of one metal plate member 2 are respectively inserted into the mounting holes 4 of another metal plate member 2, and then the arms 6 of the mounting lugs 3 are hammered down, thereby securing the respective mounting lugs 3 to the respective mounting holes 4. This heat sink assembly process requires much time and labor, resulting in a high manufacturing cost.

SUMMARY OF THE INVENTION

The present invention has been accomplished under the circumstances in view. It is one object of the present invention to provide a heat sink, which has a steady structure and is easy to assemble.

To achieve this and other objects of the present invention, the heat sink comprises a plurality of plate members arranged in a stack. Each plate member comprises a rectangular body, a first sidewall perpendicularly extending from a first side of the rectangular body, and a second sidewall perpendicularly extending from a second side of the rectangular body. The rectangular body has a mounting hole, which has a big hole portion disposed adjacent to the first sidewall and a small hole portion extending from one side of the big hole portion remote from the first sidewall. The big hole portion has a width greater than the small hole portion. The first sidewall has a lug downwardly extending from the bottom side thereof for insertion into the mounting hole of another plate members, and a retaining portion. The lug has a head and a neck connected between the head and the first sidewall. The head has a width greater than the small hole portion of the mounting hole and not greater than the big hole portion of the mounting hole. The retaining portion is adapted to press on the lug of another plate member and to partially engage into the big hole portion of the mounting hole of another plate member.

DETAILED DESCRIPTION OF THE INVENTION

Figure 1:
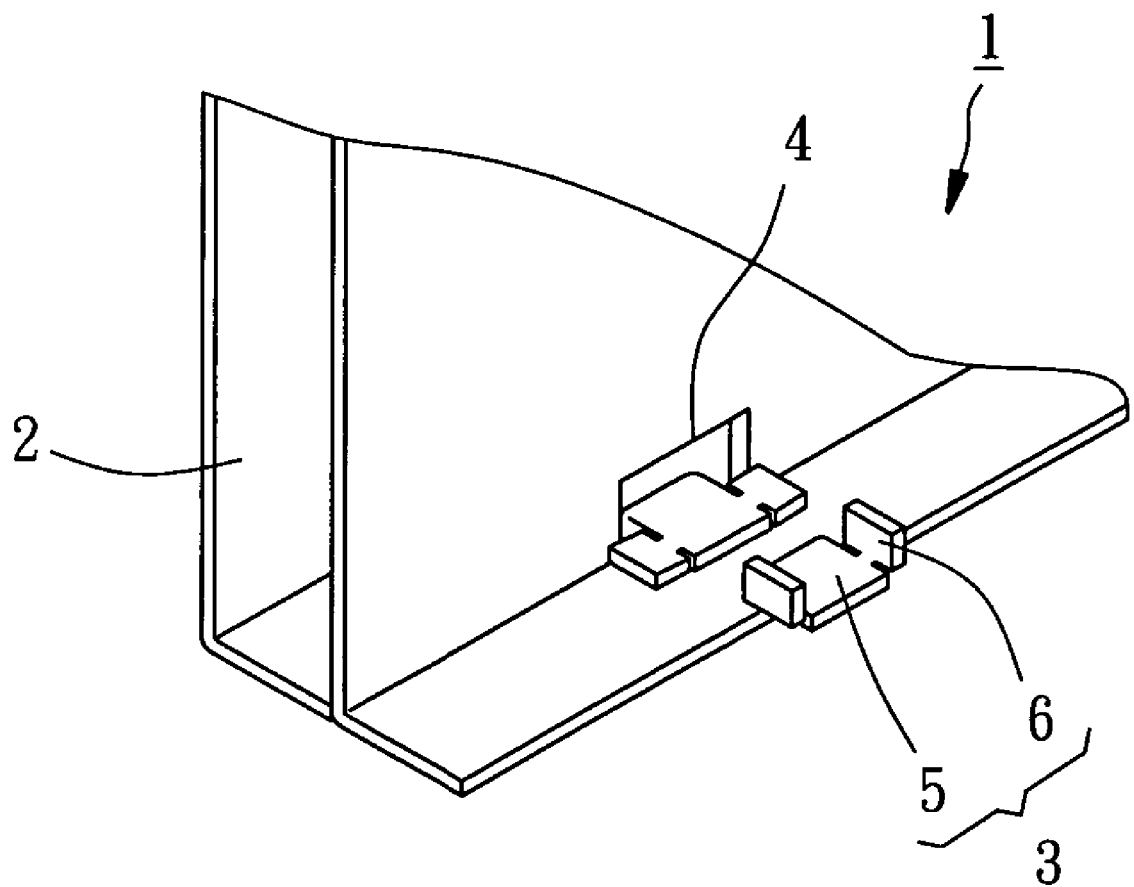
FIG. 1 is a perspective view of a heat sink according to the prior art.
Figure 2:
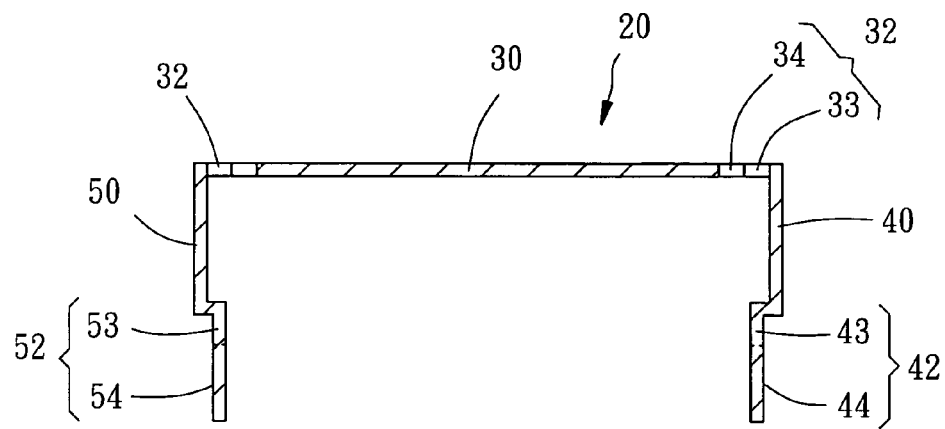
FIG. 2 is a front view of a plate member for heat sink according to a first embodiment of the present invention.
Figure 3:
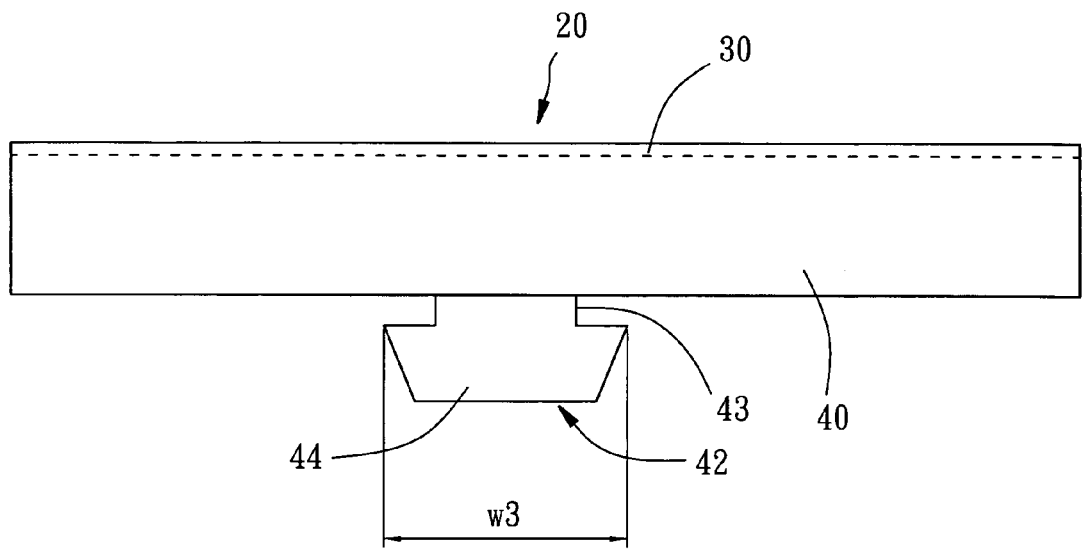
FIG. 3 is a side view of the plate member shown in FIG. 2.
Figure 4:
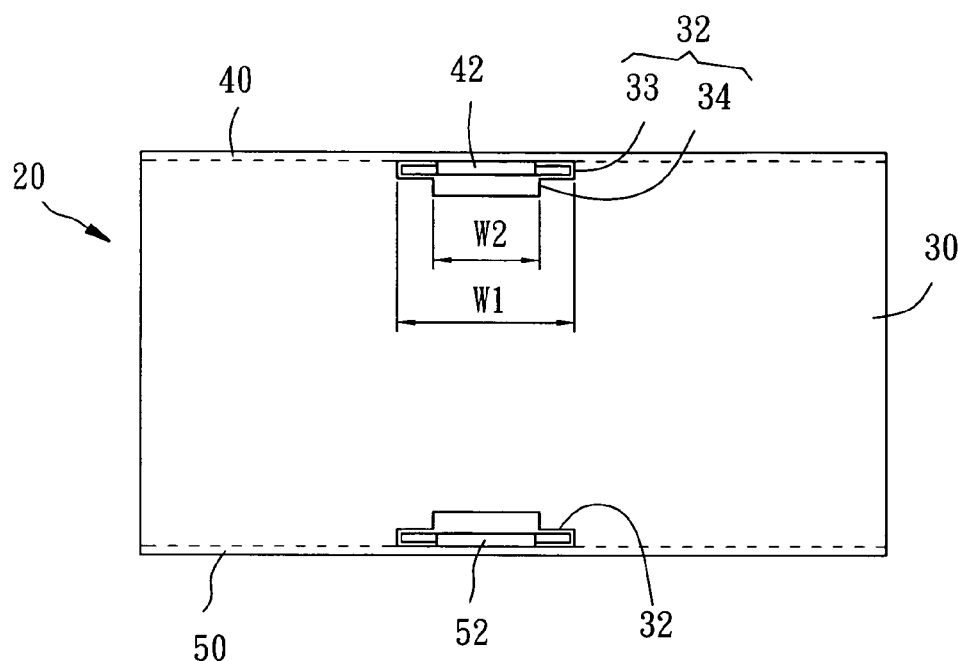
FIG. 4 is a top view of the plate member shown in FIG. 2.

Referring to FIGS. 2-6, a heat sink 10 in accordance with the first embodiment of the present invention is shown comprised of a plurality of plate members 20 arranged in a stack. Each plate member 20 has a flat rectangular body 30, and two parallel sidewalls, namely, the first sidewall 40 and the second sidewall 50 respectively perpendicularly extending from two opposite long sides of the rectangular body 30 in same direction.

The flat rectangular body 30 has two T-shaped mounting holes 32 symmetrically disposed near the two opposite long sides and extending through the top and bottom surfaces thereof. Each T-shaped mounting hole 32 has a big hole portion 33 adjacent to one sidewall 40 or 50, and a small hole portion 34 extending from the big hole portion 33. The width w1 of the big hole portion 33 is greater than the width w2 of the small hole portion 34.

The first sidewall 40 comprises a lug 42. The lug 42 has a head 44 and a neck 43 connected to between the first sidewall 40 and the head 44. The width w3 of the head 44 of the lug 42 is greater than the width w2 of the small hole portion 34 of the mounting hole 32, and not greater than the width w1 of the big hole portion 33 of each T-shaped mounting hole 32.

Similar to the structure of the first sidewall 40, the second sidewall 50 comprises a lug 52. The lug 52 has a head 54 and a neck 53 connected between the second sidewall 50 and the head 54.

Figure 5:
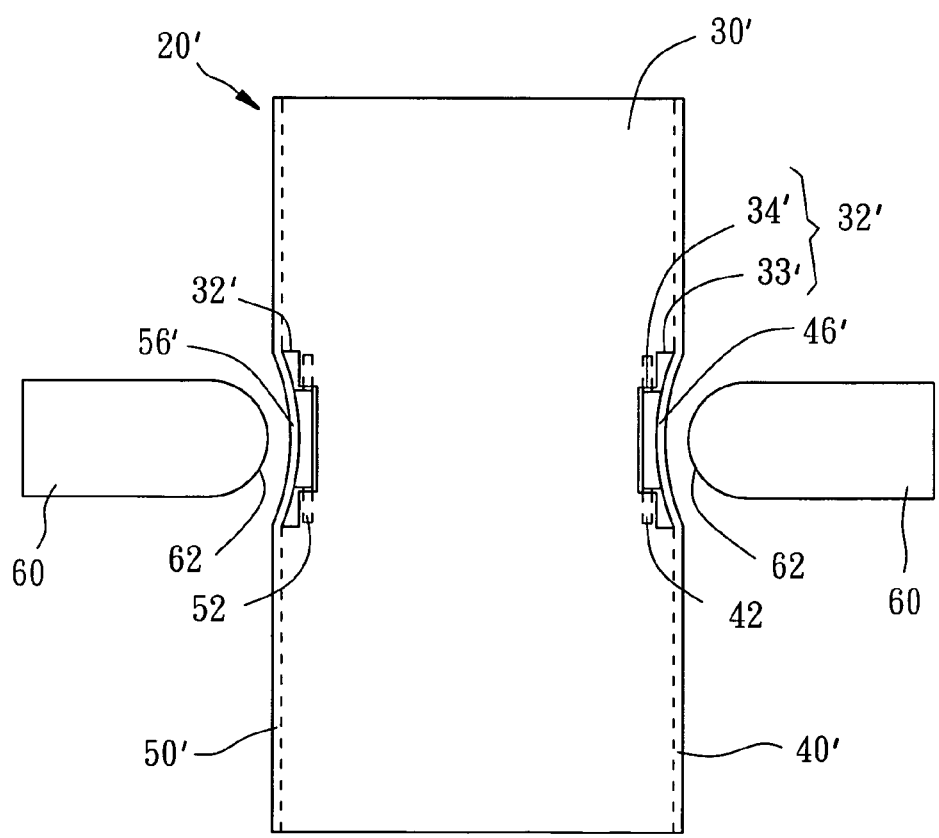
FIG. 5 is a schematic drawing showing the assembly procedure of a heat sink according to the first embodiment of the present invention (I).
Figure 6:
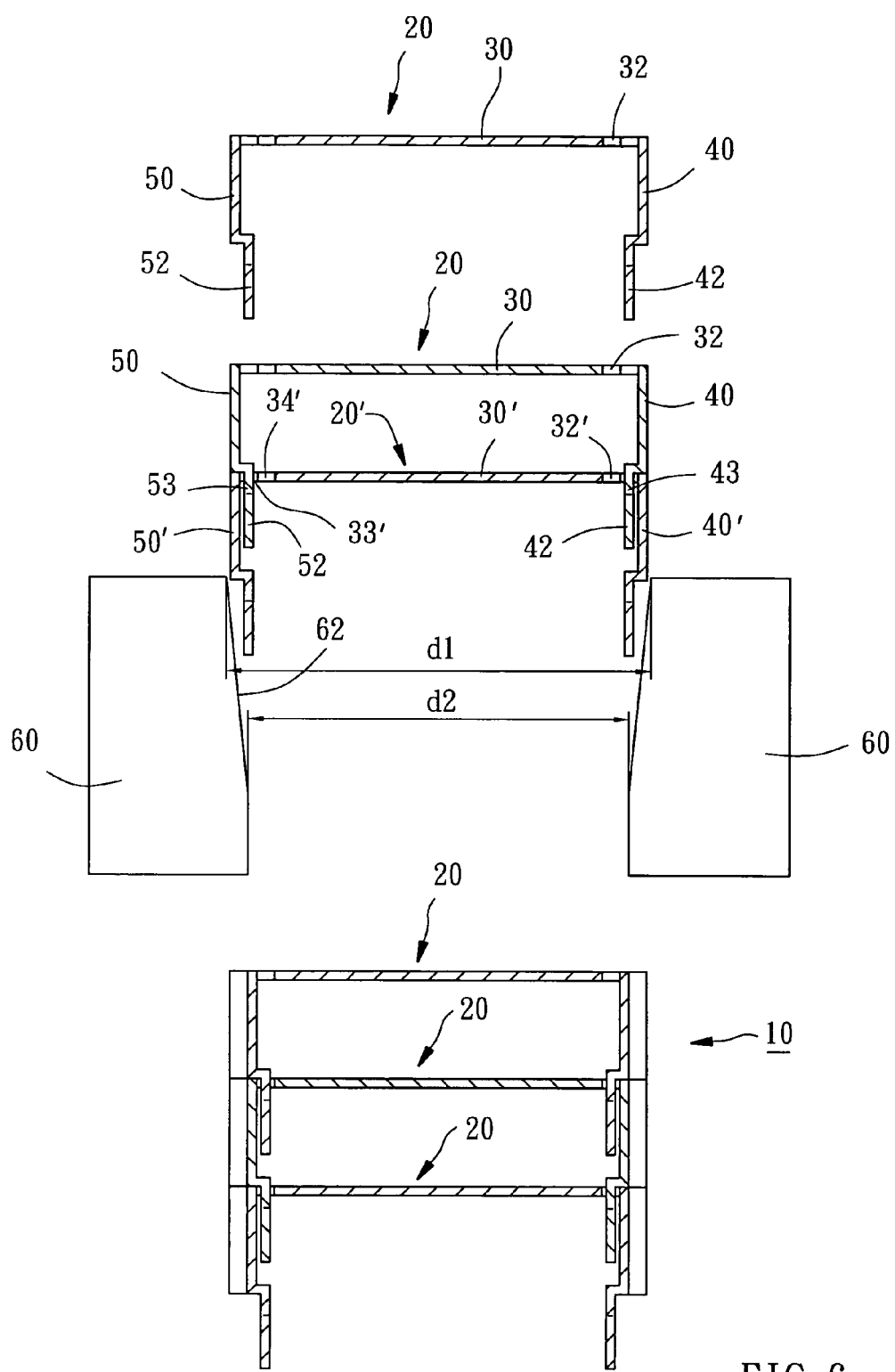
FIG. 6 is a schematic drawing showing the assembly procedure of a heat sink according to the first embodiment of the present invention (II).
Figure 7:
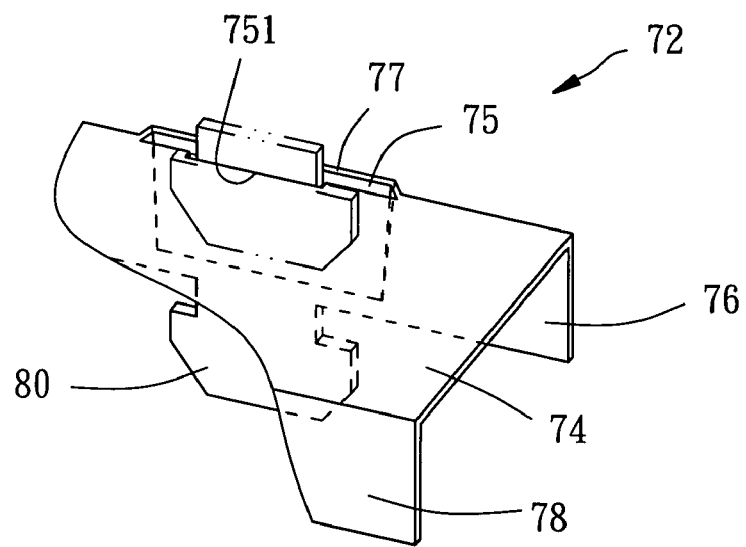
FIG. 7 is perspective view of a part of a plate member for heat sink according to a second embodiment of the present invention.
Figure 8:
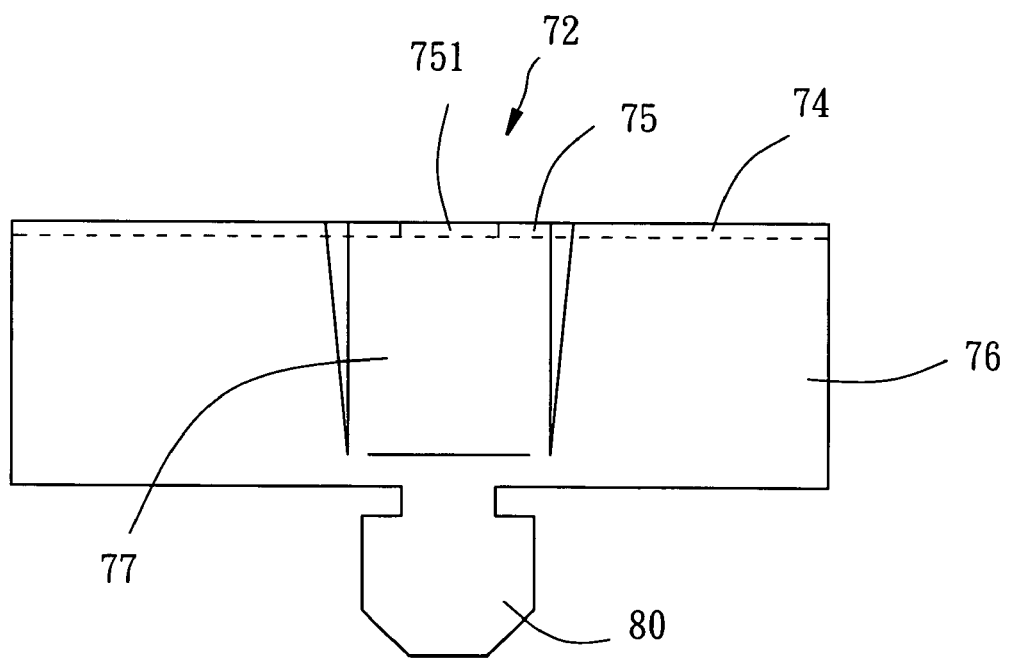
FIG. 8 is a side view of a plate member for heat sink according to the second embodiment of the present invention.
Figure 9:
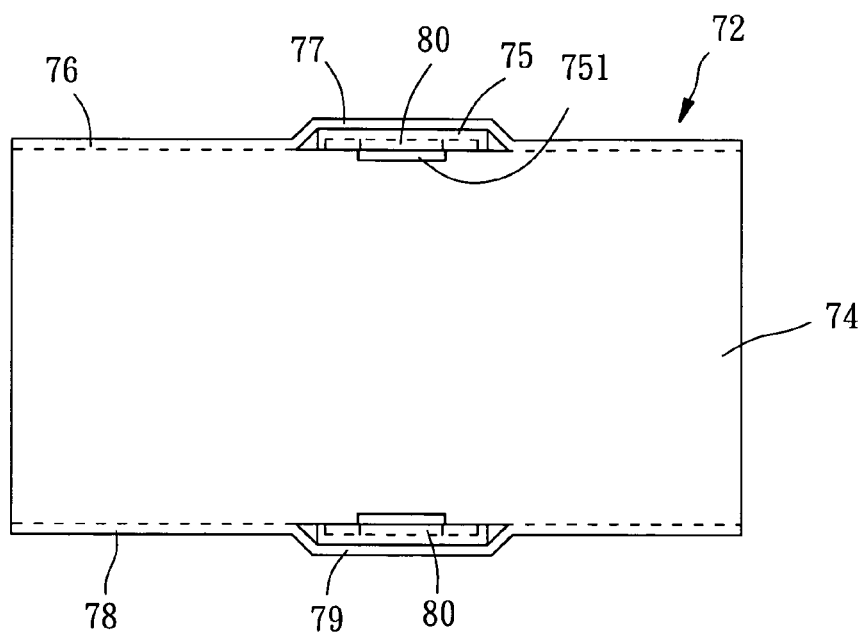
FIG. 9 is a top view of a plate member for heat sink according to the second embodiment of the present invention.

Referring to FIGS. 5 and 6, when assembling the plate members 20 to form the heat sink 10, the lugs 42 and 52 of a first plate member 20 are respectively inserted into the big hole portion 33' of each T-shaped mounting hole 32' of a second plate member 20' as shown in FIG. 6, and then a press mold 60 is used to press the first sidewall 40' and second sidewall 50' of the second plate member 20', as shown in FIG. 5, causing the corresponding part of each of the first and second sidewalls 40' and 50' of the second plate member 20' to curve inwards and to form a respective retaining portion 46' or 56'. Upon formation of the retaining portions 46' and 56', the lugs 42 and 52 of the first plate member 20 are deformed by the retaining portions 46' and 56', thereby forcing the necks 43 and 53 of the lugs 42 and 52 of the first plate member 20 into engagement with the small hole portions 34' of the T-shaped mounting holes 32' of the second plate member 20' respectively. At this time, the topside of each of the retaining portion 46' and 56' is respectively engaged into the big hole portion 33' of each T-shaped mounting hole 32' of the second plate member 20'. By means of repeating the aforesaid procedure, the plate members 20 are fastened together to form the desired heat sink 10.

In actual practice, the plate members 20 can be arranged in a stack with the lugs 42 and 52 of one plate member engaged into the T-shaped mounting holes 32 of another respectively, and then a press mold 60 that has two bevel surfaces 62 is used to stamp the sidewalls 40 and 50 of the plate members 20, causing the first and second sidewalls 40 and 50 of the plate member 20 to curve inwards and to form a respective retaining portion 46 or 56. Upon formation of the retaining portions 46 and 56, the lugs 42 and 52 of the plate member 20 are deformed by the respective retaining portions 46 and 56, thereby forcing the necks 43 and 53 of the mounting lugs 42 and 52 of one plate member 20 into engagement with the small hole portions 34 of the T-shaped mounting holes 32 of another plate member 20 respectively. Further, it is to be noted that the distance d1 between the top side of the bevel surfaces 62 is greater than the distance d2 between the bottom side of the bevel surfaces 62. This assembly procedure is simple and rapid. When assembled, the whole structure of the heat sink is steady.

Further, according to the aforesaid first embodiment of the present invention, the first sidewall and the second sidewall are respectively perpendicularly extending from the two opposite long sides of the rectangular body in same direction. Alternatively, the first and second sidewalls can be respectively perpendicularly extending from two adjacent sides of the rectangular body; the number and shape of the lugs, T-shaped mounting holes or retaining portions be variously embodied.

Figure 10:
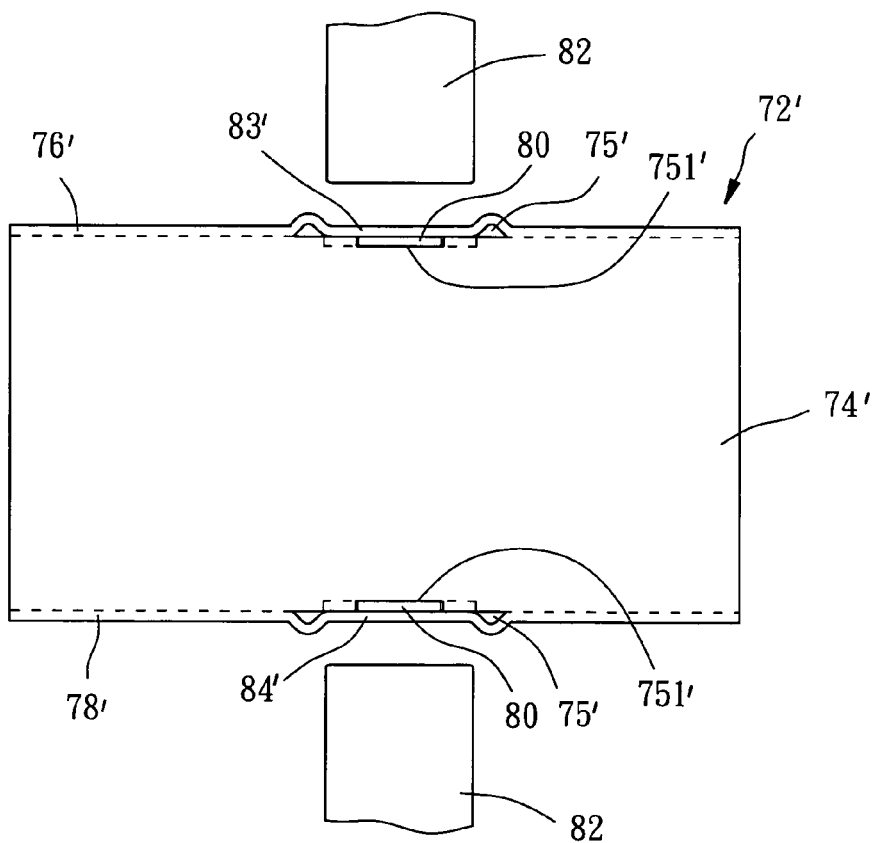
FIG. 10 is a schematic drawing showing the assembly procedure of a heat sink according to the second embodiment of the present invention (I).
Figure 11:
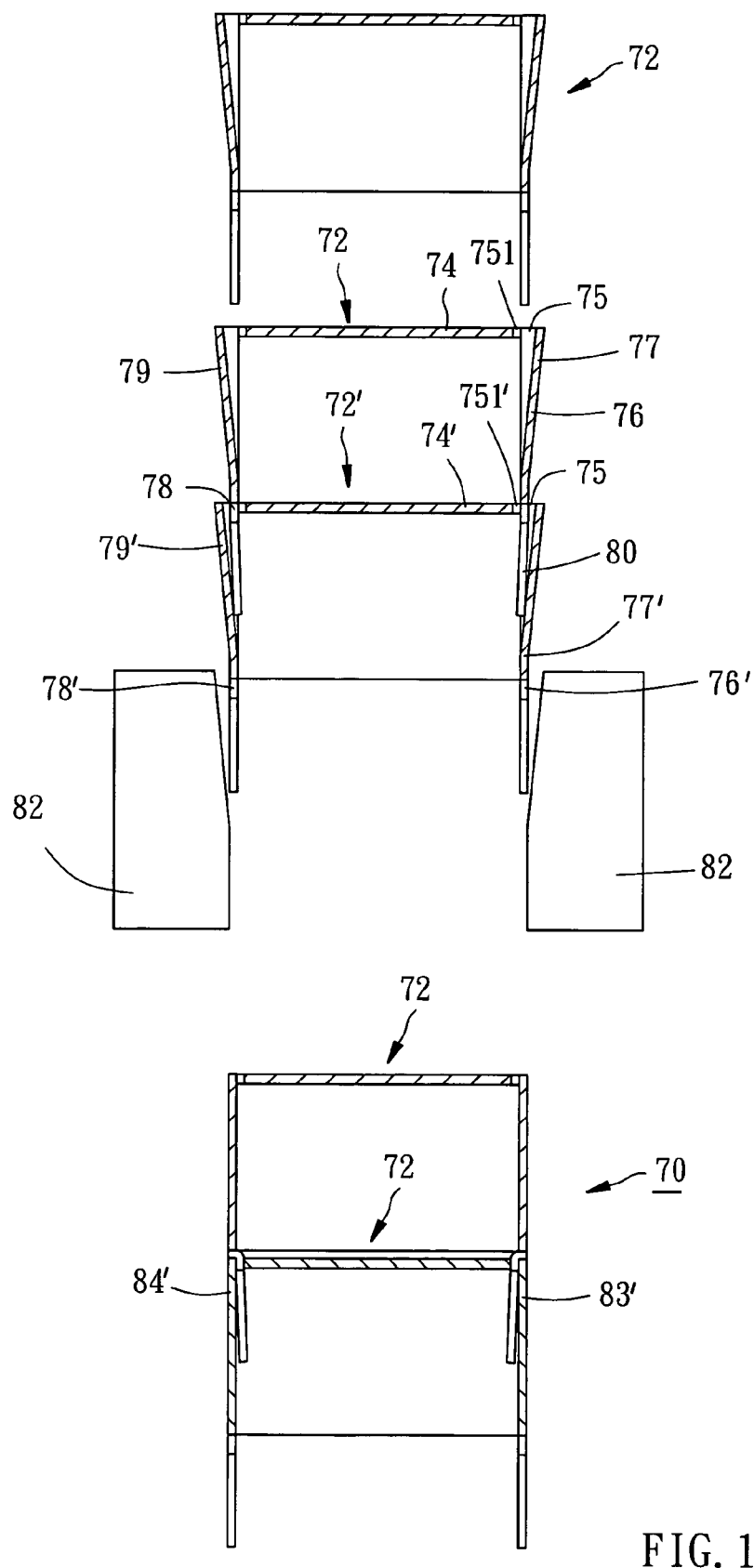
FIG. 11 is a schematic drawing showing the assembly procedure of a heat sink according to the second embodiment of the present invention (I).

FIGS. 7-10 show a heat sink 70 constructed according to the second embodiment of the present invention. According to this embodiment, the heat sink 70 is comprised of a plurality of plate members 72 arranged in a stack. Each plate member 72 has a flat rectangular body 74, and two parallel sidewalls, namely, the first sidewall 76 and the second sidewall 78 respectively perpendicularly extending from two opposite long sides of the rectangular body 74 in same direction. The flat rectangular body 74 has two mounting holes 75 symmetrically disposed near the two opposite long sides. The first sidewall 76 and the second sidewall 78 each have a lug 80. Further, the first sidewall 76 and the second sidewall 78 each have a protruding wall portion 77 or 79 on the middle corresponding to the mounting holes 75. During assembly procedure, as shown in FIGS. 10 and 11, the two lugs 80 of a first plate member 72 are respectively inserted into the two mounting holes 75' of a second plate member 72'. When the two plate members 72 and 72' are moved through a press mold 82, the press mold 82 forces the protruding wall portion 77' and 79' of the second plate member 72' inwards to form a respective retaining portion 83' or 84'. At the same time, the lugs 80 of the first plate member 72 are forced into the small hole portions 751' of the mounting holes 75' of the second plate member 72' respectively, and therefore the two plate members 72 and 72' are firmly secured together. By means of this procedure, all the plate members 72 are fastened together, forming the desired heat sink 70. According to this second embodiment, the heat sink 70 can easily and rapidly be assembled. Further, because the retaining portions 83 and 84 and the sidewalls 76 and 78 are respectively disposed in a flush manner after the assembly procedure, the heat sink 70 has a neat outer looking.

A prototype of heat sink has been constructed with the features of FIGS. 2-11. The heat sink functions smoothly to provide all of the features discussed earlier.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A heat sink comprising a plurality of plate members arranged in a stack, said plate members each comprising a rectangular body, a first sidewall perpendicularly extending from a first side of said rectangular body, and a second sidewall perpendicularly extending from a second side of said rectangular body, wherein the rectangular body of each of said plate members has a mounting hole, said mounting hole having a big hole portion disposed adjacent to said first sidewall and a small hole portion, said big hole portion having a width greater than said small hole portion;

said first sidewall has a lug extending from a bottom side thereof for insertion into the mounting hole of another one of said plate members, and a retaining portion, said lug having a head and a neck connected between said head and said first sidewall, said head having a width greater than the small hole portion of said mounting hole and not greater than the big hole portion of said mounting hole, said retaining portion being adapted to press on the lug of another one of said plate members and to partially engage into the big hole portion of the mounting hole of another one of said plate members.

2. The heat sink as claimed in claim 1, wherein the retaining portion of the first sidewall of each of said plate members is disposed substantially in flush with the first sidewall of the respective plate member.

3. A heat sink fabrication method comprising the steps of:

(a) preparing a plurality of plate members, said plate members each comprising a rectangular body, a first sidewall perpendicularly extending from a first side of said rectangular body, and a second sidewall perpendicularly extending from a second side of said rectangular body, said rectangular body having a mounting hole, said mounting hole having a big hole portion disposed adjacent to said first sidewall and a small hole portion extending from one side of said big hole portion remote from said first sidewall, said first sidewall having a lug downwardly extending from a bottom side thereof, said lug having a head and a neck connected between said head and said first sidewall, said head having a width greater than the small hole portion of said mounting hole and not greater than the big hole portion of said mounting hole;

(b) inserting the lug of a first one of said plate members into the mounting hole of a second one of said plate members; and (c) using a press mold to impart a pressure to the first sidewall of said second one of said plate members to deform a part of the first sidewall of said second one of said plate members and to have the deformed part of the first sidewall of said second one of said plate members form a retaining portion that deforms the lug of said first one of said plate members, forcing the neck of the lug of said first one of said plate members into engagement with the small hole portion of the mounting hole of said second one of said plate members.

4. The heat sink fabrication method as claimed in claim 3, wherein said retaining portion is disposed in flush with the respective first sidewall.

5. The heat sink fabrication method as claimed in claim 3, wherein the rectangular body of each of said plate members further has a second mounting hole disposed adjacent to the second sidewall of the respective plate member; the second sidewall of each of said plate members has a lug extending from a bottom side thereof for engaging into the second mounting hole of another one of said plate members; said press mold has two beveled surfaces adapted to deform the first sidewall and second sidewall of each of said plate members upon insertion of said plate members through said press mold between said two beveled surfaces downwardly from a top side toward a bottom side and to cause a part of each of the first sidewall and second sidewall of each of said plate members to form a respective retaining portion.

* * * * *